United States Patent [19]

Alcorn et al.

[11] 4,201,800
[45] May 6, 1980

[54]
[75] Inventors: George E. Alcorn, Reston, Va.; David L. Bergeron, Winooski, Vt.; Geoffrey B. Stephens, Cary, N.C.

[73] Assignee: International Business Machines Corp., Armonk, N.Y.

[51] Int. Cl. .......................... C03C 15/00; C03C 27/06
[52] U.S. Cl. ..................................... 430/5; 148/187; 156/643; 156/657; 156/661.1; 427/43.1; 427/265; 427/340; 427/385 R
[58] Field of Search ................ 96/35.1, 36, 36.2, 36.3, 96/38.4; 148/1.5, 187; 156/659, 661, 662; 427/43, 259, 265, 270, 340, 385

[56] References Cited

U.S. PATENT DOCUMENTS

| 4,068,018 | 1/1978 | Hashimoto et al. | 427/43 X |
|---|---|---|---|
| 4,088,490 | 5/1978 | Duke et al. | 427/43 X |

Primary Examiner—William A. Powell
Attorney, Agent, or Firm—John E. Hoel

[57] ABSTRACT

An improved mask fabrication process is disclosed which may be broadly applied to ion-implantation, reactive plasma etching, or the etching of semiconductor structures. The process is based upon the deposition onto an oxide coated or bare semiconductor surface, of a first photoresist layer having formed therein a plurality of windows and which is hardened by a wet chemical technique so as to have an increased resistance to dissolution in solvents. A second photoresist layer is deposited over the surface and windows of the first layer and a subplurality of windows are formed therein over selected windows in the first photoresist layer so as to selectively block a portion of the plurality of windows in the first layer. This composite mask invention may then be employed to carry out an ion-implantation step, wet etching step or reactive plasma etching step on the oxide or semiconductor surface exposed through composite windows. The second layer of photoresist may then be removed and a substitute photoresist layer may be deposited on the surface and windows of the first, hardened photoresist layer and a different subplurality of windows in the substitute layer may be selectively formed over selected windows in the hardened photoresist layer, thereby selectively blocking a different combination of windows in the first, hardened layer.

No Claims, No Drawings

HARDENED PHOTORESIST MASTER IMAGE MASK PROCESS

FIELD OF THE INVENTION

The invention generally relates to semiconductor manufacturing processes and more particularly relates to a process for forming improved bipolar transistors.

BACKGROUND OF THE INVENTION

A reduction in the size of and the self-alignment of the mask windows would permit a merged transistor structure to be formed having a reduced PNP emitter-base diffusion capacitance, a lower upward NPN collector-base capacitance, a lower PNP base series resistance, and an increased probability of avoiding collector-emitter pipe defects. However, the prior art has been unable to form self-aligned contact and guardring windows on the order of one-micron or less across so as to permit the practical formation of a minimum size (self-aligned) merged transistor logic or merged transistor memory device with a minimum number of critical masks and hot processing steps. U.S. Pat. No. 4,009,057 to Brebisson, et al., discloses a process for forming a vertical NPN transistor which employs the step of forming an oxide layer 4, through which all of the contact holes are etched, followed by sequential steps of selectively blocking various combinations of those windows with a photoresist layer 6, and ion-implanting structures through the openings in the photoresist. Brebisson, et al., removes the masking oxide layer and later forms a passivation layer. Brebisson, et al., cannot make a double diffused lateral PNP as a thick oxidation layer 6, around the oxidation impervious nitride masking layers 5, forms the well known "birds-beak" configuration which would consume the lateral PNP base. In addition, the thickness of the oxide layer 4, approximately 6000 Angstroms, would cause the nitride layer 5 to pop off for window sizes of approximately one-micron. Furthermore, the stress in the emitter-base region of the lateral PNP due to the displacement of the nitride layer 5 by the oxide layer 4, would cause increased recombination sites to form thereby degrading the performance of the resulting device, especially in low current operation.

This prior art process is considered an impractical and quite likely unworkable process as may be seen from FIG. 7 where nitride layer 14b2 must be lifted off the oxide layer 4P by means of etching underneath the nitride layer, a questionable process having a low yield.

Copending U.S. Pat. application Ser. No. 829,302 filed D. L. Bergeron, et al., now U.S. Pat. No. 4,110,126, assigned to the instant assignee, shows another method to form micron to submicron windows which requires a silicon nitride layer and the reoxidation of the guardring.

OBJECTS OF THE INVENTION

It is therefore an object of the invention to provide a micron to sub-micron window size for a semiconductor device.

It is another object of the invention to provide a micron to sub-micron window size for a semiconductor device with a minimum number of hot process steps.

It is another object of the invention to form a guardring which is self-aligned to all contacts and top down only isolation regions.

It is another object of the invention to form a double diffused PNP whose base is compatible with the reach through/guardring of the NPN device, and whose collector is compatible with the base of the NPN, and whose emitter is compatible with the base contact of the NPN.

It is another object of the invention to form a merged transistor structure with lower PNP emitter-base diffusion capacitance and lower series base resistance. It is still another object to form a merged transistor structure with a reduced collector-base capacitance for the upward injecting NPN and an increased probability of avoiding collector-emitter pipe defects.

SUMMARY OF THE INVENTION

These and other objects are accomplished by the improved mask fabrication process disclosed which may be broadly applied to ion-implantation, reactive plasma etching, or the etching of semiconductor structures. The process is based upon the deposition onto an oxide coated or bare semiconductor surface, of a first photoresist layer having formed therein a plurality of windows and which is hardened by a wet chemical, ion-implantation, reactive plasma, or a reactive ion technique so as to have an increased resistance to dissolution in solvents. A second photoresist layer is deposited over the surface and windows of the first layer and a subplurality of windows are formed therein over selected windows in the first photoresist layer so as to selectively block a portion of the plurality of windows in the first layer. This composite mask invention may then be employed to carry out an ion-implantation step, wet etching step or reactive plasma etching step on the oxide or semiconductor surface exposed through composite windows. The second layer of photoresist may then be removed and a substitute photoresist layer may be deposited on the surface and windows of the first, hardened photoresist layer and a different subplurality of windows in the substitute layer may be selectively formed over selected windows in the hardened photoresist layer, thereby selectively blocking a different combination of windows in the first, hardened layer. Some of the advantages of this technique are that it is a lower temperature process requiring no reoxidation and therefore inducing fewer defects in the semiconductor substrate. The hardened photoresist mask is more simple and more precise than metal masks, requiring no subetching of the metal. When the hardened photoresist master image mask is applied to an oxidized layer on the surface of a semiconductor substrate, the mask may be used to form both the holes in the oxide and the ion-implanted or etched structure in the semiconductor substrate, thereby yielding self-aligned structures.

DESCRIPTION OF THE FIGURES

These and other objects, features and advantages of the invention can be more fully appreciated with reference to the accompanying drawings.

DISCUSSION OF THE PREFERRED EMBODIMENT

The implementation of a dynamic RAM cell is limited by several practical limitations:

1. The NPN active base region intercepts the surface where it is susceptible to inversion and current gain degradation from surface charge.
2. The PNP emitter injects current which is collected on three sides by the P isolation region.
3. The ratio of the NPN collector-base to emitter base capacitance and hence the signal level and '1' and '0' discrimination level is low.

The process disclosed improves each of the shortcomings discussed above. The process incorporates an unmasked boron ion-implant to form the NPN base - PNP collector and top isolation. This P region is subsequently isolated into separate regions by an N type phosphorous implant which is self-aligned through special masking sequences to the NPN emitter and self-aligned on one side to the PNP emitter. The implant doses and energies and subsequent heat treatments are designed to give somewhat independent control of the NPN emitter-base, and collector-base capacitance.

By choosing a relatively high resistivity base ($\sim$ 1000 $\Omega/\square$) and using a double energy implant, the base concentrations and hence emitter-base capacitance can be kept low. The collector-base capacitance is affected by the concentration of the phosphorous implant as well as the entire base profile. The phosphorous implant will extend through the base vertically and completely surround the base for lateral isolation, thus high sidewall capacitance.

The phosphorous implant also forms the base of the "double diffused" PNP. The PNP is masked on three sides to give a large lateral integrated base doping to prevent injection into adjacent isolation or cell regions.

The masking sequence disclosed here makes use of a photoresist layer which is baked at a sufficient temperature to render the resist insoluble and immovable in subsequent photoresist applications. This masking layer is defined by a photo mask in the process sequence outlined in FIGS. 1-5 below. It defines the windows for subsequent etches and ion-implants which are selectively blocked out by photoresist. At the conclusion of each subsequent etch/implant the blocking photoresist is removed without removing the temperature hardened layer of photoresist and a new layer is deposited and exposed.

The process sequence as outlined in FIGS. 1-5 below follows a conventional buried collector and buried isolation process up through and including epitaxy deposition and oxidation. A first and second photolithographic steps are used to define such buried regions.

Figure 1:
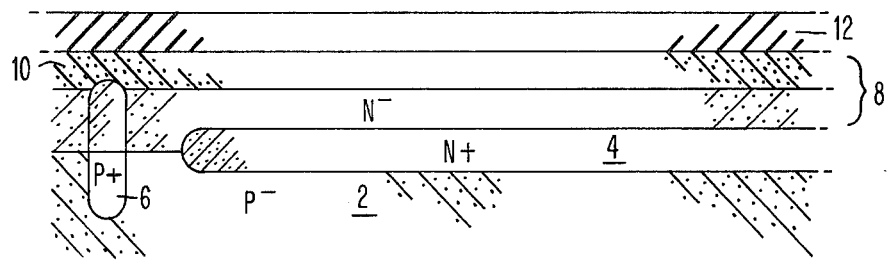
FIG. 1 is a cross-sectional view of a semiconductor substrate having a buried N+ region and epitaxial layer formed thereover and a P type layer formed in the surface of the epitaxial layer followed by a final passivation silicon dioxide layer.

An unmasked dual energy boron profile is implanted through the oxide into the N-epi region as shown in FIG. 1. Next the masking layer 14 is deposited and a master image mask is defined by a third photolithographic mask. The master image mask 14 is photoresist mask which is temperature hardened at approximately 180° C. In order to maintain the definition of the windows in the temperature hardened resist, an additive such as Lubersol 101 may be added. The PR master image mask is no longer photosensitive but can be removed when desired by ashing. Standard PR techniques will not remove temperature hardened PR master image mask 14.

Figure 3:
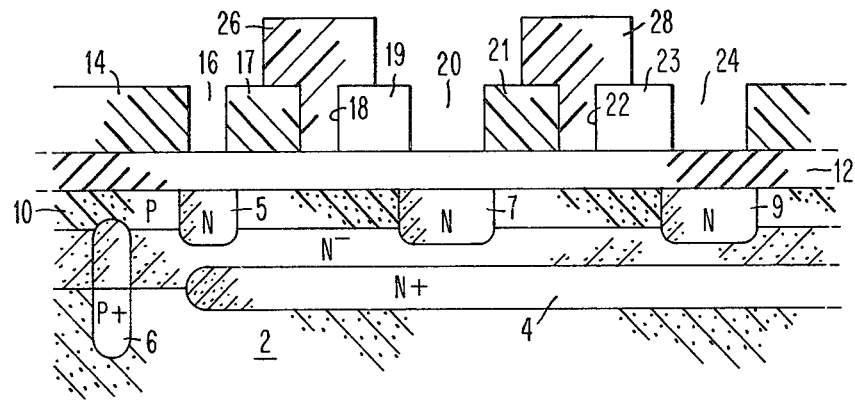
FIG. 3 is a cross-sectional view of the structure of FIG. 2B during a subsequent step when a first selective blocking photoresist layer is deposited on the master image mask.

Next the reach through blocking photo layer 26 and 28 is applied and defined by a fourth photolithographic mask. The N type reach through 5 is formed by implanting phosphorous at sufficient energy to penetrate the oxide 12 and the base region 10 as shown in FIG. 3.

After removal of the previous layer of photoresist 26 and 28, a new layer 34, 36, 38 is deposited and defined by a fifth photolithographic mask. This photo layer 34, 36, 38 both blocks the subsequent implant and actually defines the window 37, 39 for the P+ implant 25 and 27 on the three sides of the PNP emitter. This is done to keep the PNP base width (N region) large and base concentration high on those sides where injection is not desirable, that is toward isolation regions or adjacent cells.

After removal of the photo layer 34, 36, and 38, a new layer 30 and 32 is applied and defined by a sixth photolithographic mask which blocks out all areas except where an arsenic emitter 13 is desired and has been defined previously by the master image mask 14. After etching the oxide 12 in these areas, an arsenic layer 11, 13 and 15 is implanted at approximately 50 Kev, at an $8 \times 10^{15}$ cm$^{-2}$ dose which, when driven in by the final anneal heat step, forms the NPN emitter 13. It also forms collector contact 11 when used in conjunction with phosphorous implant formed previously.

All photoresist is now removed, the hardened layer 14 being removed by ashing.

The final anneal step drives in the arsenic emitters 13 and 15 as well as determines the final position of the other implanted profiles. The process then follows a conventional scheme for interconnections and terminal metallurgy.

The result is a structure which is self-aligning to all surface contacts and between active regions of the device. Good performance tracking is assured by the one mask scheme using the master image mask 14 for defining images and spacings. The surface concentration of the base 10 can be kept high independent of the intrinsic base doping. The PNP emitter 25 and 27 can be designed to only inject minority carriers toward the NPN base 10. And an NPN is now made available whose collector 5, base 10 and emitter 13 or 15 are compatible with conventional photolithography capabilities.

A more detailed discussion of the inventive process follows.

FIG. 1 illustrates a cross-sectional view of the structure after two photolithographic masking steps have taken place to define the location of a buried N+ region 4 and a buried P+ isolation region 6 in the P- type substrate 2. On top of the substrate is an epitaxially grown silicon layer 8 having an N-conductivity type.

Following this step, a two stage boron implantation takes place, the first with an acceleration voltage of 50 Kev and the second with an acceleration voltage of 300 Kev with respective doses of approximately $10^{14}$ and $10^{13}$ atoms per square centimeter. The epitaxial layer 8 is approximately 2 microns thick and the boron implantation profile extends approximately 0.8 microns below the surface of the epitaxial layer. Following this step, a layer 12 of silicon dioxide is thermally grown on the surface of the epitaxial layer 8 to a thickness of approximately 3000 Angstroms. The resulting structure is shown in cross-section FIG. 1 at this stage.

Figure 2A:
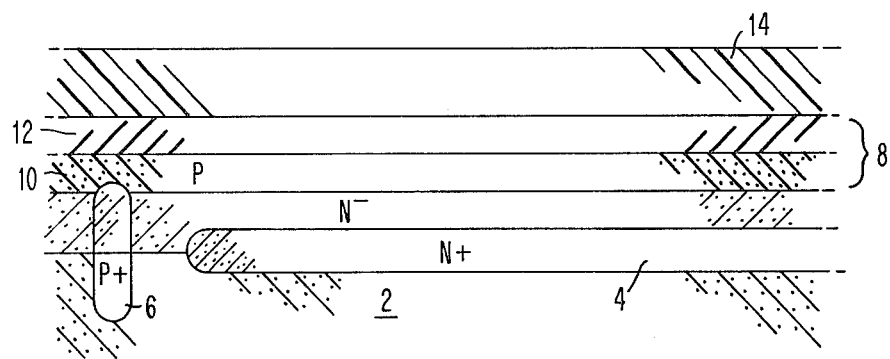
FIG. 2A illustrates a cross-sectional view of the structure shown in FIG. 1 during a subsequent step when a layer of photoresist material has been deposited on top of the silicon dioxide layer.

FIG. 2A illustrates the next step where a layer of photoresist material 14 is deposited on the surface of the silicon dioxide layer 12, which will serve as the master image mask for the selective blocking technique. The photoresist layer 14 may be for example the conventional photoresist material specified as AZ1350J manufactured by the Shipley Company. The photoresist material 14 may also be a layer of polymethyl methacrylate.

Figure 2B:
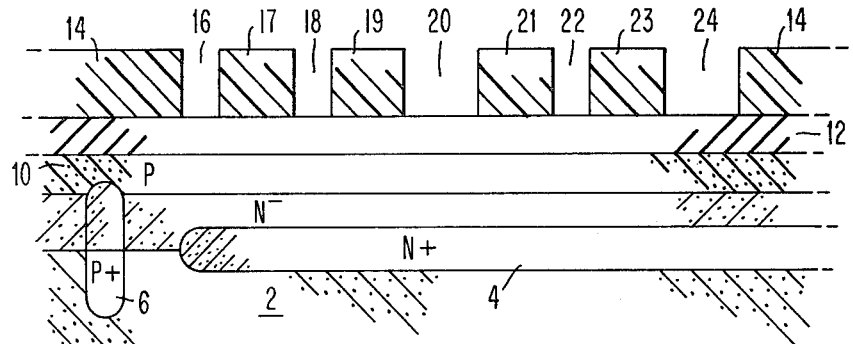
FIG. 2B illustrates a cross-sectional view of the structure of FIG. 2A during a subsequent step when the photoresist layer has been patterned into a master image mask and that mask has been hardened.

FIG. 2B shows the next step in the sequence where the photoresist layer 14 is hardened by chemical, thermal, ion-implantation or reactive plasma techniques as will be described below, after the master image pattern has been formed in the layer 14. For example, if the layer 14 is a photoresist such as AZ1350J mentioned above, a photolithographic mask is applied to the surface of the photoresist layer 14 and an optical image pattern is laid over the layer 14 so that the regions 16, 18, 20, 22 and 24 are rendered more soluble in a solvent. For a positive photoresist, the exposure light would strike the sections 16, 18, 20, 22 and 24. For negative photoresist, the exposure light would be masked from the regions 16, 18, 20, 22 and 24. The object, however, is to open windows in these regions 16, 18, 20, 22 and 24 which will remain in position through a series of subsequent masking steps using an overlying blocking mask layer.

After the pattern of windows, 16, 18, 20, 22 and 24 has been formed in the photoresist layer 14, the photoresist layer is hardened so as to be insoluble in the conventional photoresist solvents used to dissolve away the subsequently applied blocking masks. Hardening methods can include baking the photoresist layer 14 to further cross-link it and decrease its solubility. For example, the AZ1350J photoresist mentioned above can be baked at a temperature of approximately 180° C. which will render it insoluble to normal solvents. Alternately, the photoresist AZ1350J can be immersed in a hardening solution of sodium, 2 diazo, 1 oxynaphthalene, 4 sulfonate which will harden the photoresist layer 14. Still another alternative is to render incident upon the surface of the material 14 a beam of ions from an ion-implanter, for example, arsenic ions accelerated at 50 Kev for a dose of $5 \times 10^{15}$ cm$^{-2}$. Alternately, a plasma from a reactive plasma etching chamber will serve to cross-link a surface portion of the layer 14 so exposed thereby rendering it more resistant to dissolution.

FIG. 3 shows a subsequent step after having formed the hardened master image mask layer 14, where a selective blocking layer of conventional photoresist is applied and patterned to form the blocks 26 and 28 which will prevent a subsequent ion-implantation step from implanting in the windows 18 and 22 and permit selective ion-implantation in the windows 16, 20 and 24. The object of the implantation step for FIG. 3 is the formation of the N type guardring 5 and the N type base regions 7 and 9 for a subsequently formed PNP transistors by means of ion-implanting phosphorous ions through the oxide layer 12 at an energy of approximately 400 Kev.

Figure 4:
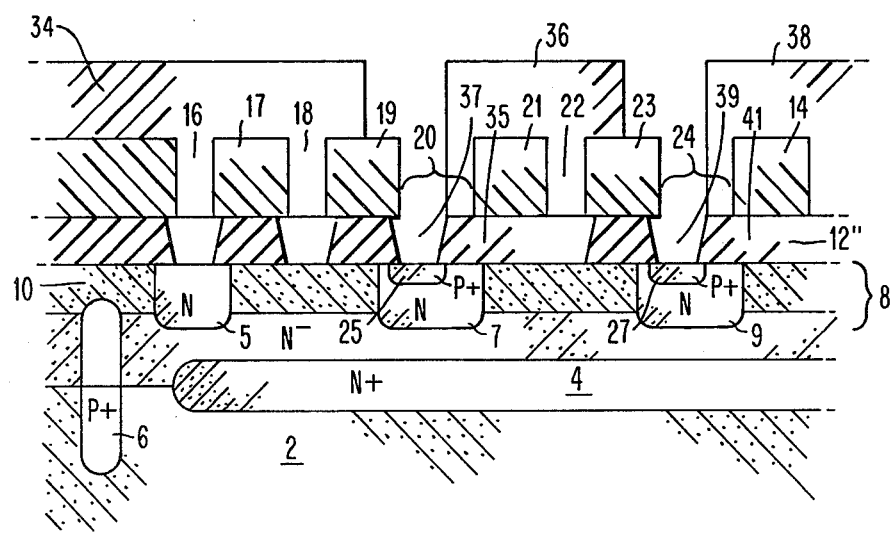
FIG. 4 is a cross-sectional view of the structure of FIG. 3 during a subsequent step when a second photoresist selective blocking mask is applied over the master image mask.

FIG. 4 shows a cross-sectional view of the subsequent step after FIG. 3 where the first blocking photoresist layer 26 and 28 is removed with a conventional photoresist solvent and a second photoresist blocking layer is applied over the master image mask 14 and is patterned to form the blocking regions 34, 36 and 38 which mask the windows 16, 18, 22 while etching the windows 37 and 39 open. It is important to note here that the blocking layer 36, for example, occupies a portion of the original window 20, thereby reducing the cross-sectional area of the resultant etched opening 37 so that the resultant ion-implanted structure 25, for example, will have a smaller area than does the preceding ion-implanted structure 7 which was exposed through the relatively larger window 20. The left edge of the P+ structure 25 has its location defined by the corresponding edge of the master image mask portion 19. This is important since the structure being formed is the PNP emitter 25 for a lateral PNP device whose base region is the N-type region 7 and whose collector region is the portion of the base implant region 10 directly to the left of the region 7 shown in FIG. 4. The width of the base region for the PNP transistor thus formed has a critical dimension which is accurately defined by the alignment of the left side of the P+ region 25 with the right side of the portion 19 of the master image mask. It is to be noted that both the left side of the PNP base region 7 and the left side of the PNP emitter region 25 are aligned by means of the same right hand edge 19 of the master image mask.

The P+ ion-implantation is formed by a boron ion beam having an acceleration voltage of approximately 40 Kev at a dosage of approximately $5 \times 10^{15}$ atoms per square centimeter.

Figure 5:
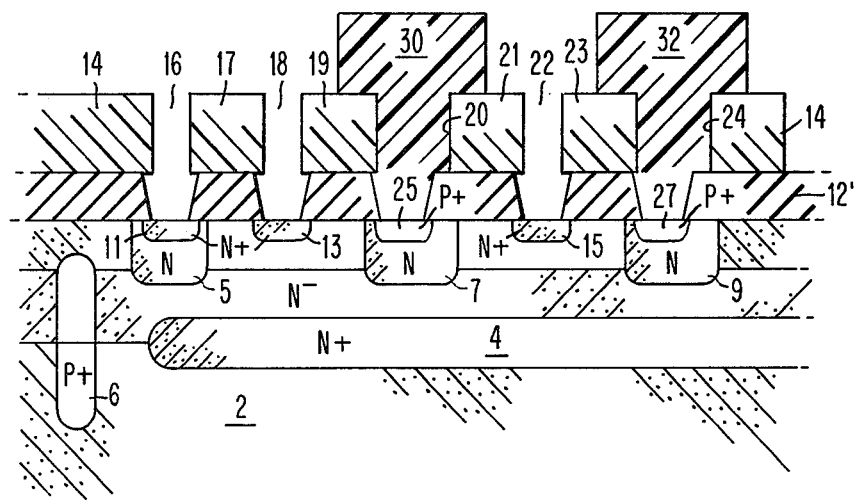
FIG. 5 is a cross-sectional view of the structure of FIG. 4 during a subsequent step when still a third photoresist selective blocking mask is applied to the master image mask, resulting in the formation of an array of bipolar dynamic random access memory devices.

The FIG. 5 shows a subsequent step after the selective blocking mask 34, 36 and 38 composed of photoresist such as AZ1350J has been dissolved with a conventional photoresist solvent. At this point, a third photoresist selective blocking mask is applied over the master image mask layer 14 which is the same master image mask which was employed in the previously described second selective blocking step shown in FIG. 4. The second selective blocking mask is patterned to form the regions 30 and 32 which will mask the windows 20 and 24 so as to prevent the etching of the oxide layer 12 beneath these windows and also to prevent the ion-implantation of ions through these windows. The windows 16, 18 and 22 are left open so that a subsequent etching step employing buffered hydrofluoric acid is employed to etch out oxide windows beneath the windows 16, 18 and 22 which is followed by the step of ion-implanting arsenic to form the N+ regions 11, 13 and 15. Region 11 will be the guardring contact, region 13 and 15 will be the emitter for a downward injecting NPN transistor or the collector for an upward injecting NPN transistor. The arsenic ion-implantation is carried out at approximately 50 Kev for a dosage of approximately $8 \times 10^{15}$ atoms per square centimeter.

At this point, the master image mask is no longer required and therefore it, along with the overlying third photoresist selective blocking mask are removed by etching in an O$_2$ plasma at around 500 watts in a reactive ion-etching chamber for about 30 minutes.

This process may be applied to both integrated injection logic devices and to bipolar dynamic random access memory devices with equal utility.

All ion-implanted structures must be annealed and the arsenic emitters must be driven in at a temperature of approximately 1000° C. in forming gas for approximately 50 minutes.

Although the invention has been particularly shown and described with reference to the preferred embodiments thereof, it will be understood by those skilled in the art that the foregoing and other changes in form and details may be made therein without departing from the spirit and the scope of the invention.

Having thus described my invention, what I claim as new, and desire to secure by Letters Patent is:

1. A process for forming an improved mask on a semiconductor substrate, comprising the steps of:
 depositing a first resist layer on the surface of said substrate;
 forming a plurality of windows in said first resist layer;
 hardening said first resist layer by immersing it in a solution of sodium, 2 diazo, 1 oxynaphthalene, 4 sulfonate;
 depositing a second resist layer over the surface and windows in said first resist layer;
 selectively forming a subplurality of windows in said second resist layer over selected ones of said plurality of windows in said first resist layer;
 whereby said second resist layer selectively blocks a portion of said plurality of windows in said first layer.

* * * * *

UNITED STATES PATENT AND TRADEMARK OFFICE
CERTIFICATE OF CORRECTION

PATENT NO. : 4,201,800
DATED : May 6, 1980
INVENTOR(S) : George E. Alcorn, et al It is certified that error appears in the above—identified patent and that said Letters Patent is hereby corrected as shown below:

The title page should be deleted to insert the attached title page therefor.

Signed and Sealed this

Fifteenth Day of July 1980

[SEAL]

Attest:

SIDNEY A. DIAMOND

Attesting Officer   Commissioner of Patents and Trademarks

United States Patent [19]

Alcorn et al.

[11] 4,201,800

[45] May 6, 1980

[54] HARDENED PHOTO RESIST MASTER IMAGE MASK PROCESS

[75] Inventors: George E. Alcorn, Reston, Va.; David L. Bergeron, Winooski, Vt.; Geoffrey B. Stephens, Cary, N.C.

[73] Assignee: International Business Machines Corp., Armonk, N.Y.

[21] Appl. No.: 900,844

[22] Filed: Apr. 28, 1978

[51] Int. Cl.² .................... C03C 15/00; C03C 27/06
[52] U.S. Cl. .................................... 430/5; 148/187;
156/643; 156/657; 156/661.1; 427/43.1;
427/265; 427/340; 427/385 R
[58] Field of Search ................ 96/35.1, 36, 36.2, 36.3,
96/38.4; 148/1.5, 187; 156/659, 661, 662;
427/43, 259, 265, 270, 340, 385

[56] References Cited

U.S. PATENT DOCUMENTS

| | | | |
|---|---|---|---|
| 4,068,018 | 1/1978 | Hashimoto et al. | 427/43 X |
| 4,088,490 | 5/1978 | Duke et al. | 427/43 X |

*Primary Examiner*—William A. Powell
*Attorney, Agent, or Firm*—John E. Hoel

[57] ABSTRACT

An improved mask fabrication process is disclosed which may be broadly applied to ion-implantation, reactive plasma etching, or the etching of semiconductor structures. The process is based upon the deposition onto an oxide coated or bare semiconductor surface, of a first photoresist layer having formed therein a plurality of windows and which is hardened by a wet chemical technique so as to have an increased resistance to dissolution in solvents. A second photoresist layer is deposited over the surface and windows of the first layer and a subplurality of windows are formed therein over selected windows in the first photoresist layer so as to selectively block a portion of the plurality of windows in the first layer. This composite mask invention may then be employed to carry out an ion-implantation step, wet etching step or reactive plasma etching step on the oxide or semiconductor surface exposed through composite windows. The second layer of photoresist may then be removed and a substitute photoresist layer may be deposited on the surface and windows of the first, hardened photoresist layer and a different subplurality of windows in the substitute layer may be selectively formed over selected windows in the hardened photoresist layer, thereby selectively blocking a different combination of windows in the first, hardened layer.

1 Claim, 6 Drawing Figures